United States Patent
Zhang

(10) Patent No.: US 9,965,986 B2
(45) Date of Patent: May 8, 2018

(54) SHIFT REGISTER UNIT AND DRIVING METHOD THEREOF, SHIFT REGISTER AND DISPLAY DEVICE

(71) Applicants: BOE Technology Group Co., Ltd., Beijing (CN); Hefei Xinsheng Optoelectronics Technology Co., Ltd., Anhui (CN)

(72) Inventor: Yuting Zhang, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

( * ) Notice: Subject to any disclaimer, the term of this patent is extended or adjusted under 35 U.S.C. 154(b) by 0 days. days.

(21) Appl. No.: 15/517,587

(22) PCT Filed: Oct. 15, 2015

(86) PCT No.: PCT/CN2015/092003
§ 371 (c)(1),
(2) Date: Apr. 7, 2017

(87) PCT Pub. No.: WO2016/206240
PCT Pub. Date: Dec. 29, 2016

(65) Prior Publication Data
US 2017/0309211 A1    Oct. 26, 2017

(30) Foreign Application Priority Data
Jun. 24, 2015    (CN) .......................... 2015 1 0353895

(51) Int. Cl.
*G11C 19/00*    (2006.01)
*G09G 3/20*    (2006.01)
(Continued)

(52) U.S. Cl.
CPC ............... *G09G 3/20* (2013.01); *G09G 3/007* (2013.01); *G09G 3/3674* (2013.01);
(Continued)

(58) Field of Classification Search
None
See application file for complete search history.

(56) References Cited

U.S. PATENT DOCUMENTS 8,587,347 B2    11/2013   Yoon et al.
8,816,728 B2    8/2014    Yoon et al.
(Continued)

FOREIGN PATENT DOCUMENTS

CN    102915698 A    2/2013
CN    103208262 A    7/2013
(Continued)

OTHER PUBLICATIONS

English translation of Written Opinion of the International Searching Authority for International Application No. PCT/CN2015/092003, dated Apr. 1, 2016, 7 pages.
(Continued)

*Primary Examiner* — Tuan T Lam
(74) *Attorney, Agent, or Firm* — Westman, Champlin & Koehler, P.A.

(57) ABSTRACT

The present disclosure discloses a shift register unit and a driving method thereof, a shift register circuit and a display device, and relates to the field of display technology, in order to solve problems of the conventional shift register that it has a complex structure, and occupies a too larger space. The shift register unit comprises an input module for receiving a signal of an input signal terminal and a signal of a high level terminal, a reset module for resetting an output terminal of the shift register unit and a pull-up control node, a pull-down module for discharging the pull-up control node and the
(Continued)

output terminal of the shift register unit, a pull-down control module for generating a power supply enable signal and a power supply signal, and an output control module for generating a gate drive signal and outputting the power supply enable signal, the power supply signal and the gate drive signal. The shift register unit provided by the present disclosure is applied to the display device.

20 Claims, 7 Drawing Sheets

(51) Int. Cl.
  *G09G 3/00* (2006.01)
  *G09G 3/36* (2006.01)
  *G11C 19/28* (2006.01)

(52) U.S. Cl.
  CPC ... *G11C 19/287* (2013.01); *G09G 2310/0202* (2013.01); *G09G 2310/0286* (2013.01); *G11C 19/28* (2013.01)

(56) References Cited

U.S. PATENT DOCUMENTS

| | | |
|---|---|---|
| 2010/0260312 A1 | 10/2010 | Tsai et al. |
| 2011/0316831 A1 | 12/2011 | Ochiai et al. |
| 2016/0321999 A1* | 11/2016 | Yang .................... G09G 3/3266 |
| 2016/0329015 A1* | 11/2016 | Ji ............................ G09G 3/32 |
| 2016/0351159 A1 | 12/2016 | Yang et al. |
| 2017/0193887 A1* | 7/2017 | Wang .................... G09G 3/2092 |
| 2017/0193961 A1* | 7/2017 | Wang .................... G09G 5/003 |

FOREIGN PATENT DOCUMENTS

| | | |
|---|---|---|
| CN | 103280198 A | 9/2013 |
| CN | 104409102 A | 3/2015 |
| CN | 104464600 A | 3/2015 |
| CN | 104867438 A | 8/2015 |

OTHER PUBLICATIONS

International Search Report and Written Opinion of International Application No. PCT/CN2015/092003, dated Apr. 1, 2016, 8 pages.
English translation of Box No. V of the Written Opinion for the International Searching Authority for International Application No. PCT/CN2015/092003, 2 pages.
First Office Action from Chinese Patent Application No. 201510353895.1, dated Jan. 22, 2017, 10 pages.
Second Office Action from Chinese Patent Application No. 201510353895.1, dated Jul. 17, 2017, 5 pages.

* cited by examiner

SHIFT REGISTER UNIT AND DRIVING METHOD THEREOF, SHIFT REGISTER AND DISPLAY DEVICE

CROSS-REFERENCE TO RELATED APPLICATION(S)

This application is a U.S. National Phase Application of International Application No. PCT/CN2015/092003, filed on Oct. 15, 2015, entitled "SHIFT REGISTER UNIT AND DRIVING METHOD THEREOF, SHIFT REGISTER AND DISPLAY DEVICE," which claims priorities to Chinese Application No. 201510353895.1, filed on Jun. 24, 2015, both of which are incorporated herein by reference in their entireties.

TECHNICAL FIELD

The present disclosure relates to the field of display technology, and particularly to a shift register unit and a driving method thereof, a shift register circuit and a display device.

BACKGROUND

In the display device, a pixel array includes gate scan lines and data lines arranged in crisscross. In order to realize progressive scanning of the pixel array, pixel cells in the pixel array are typically driven by a gate drive circuit. In the prior art, the gate drive circuit often uses a Gate Driver on Array (GOA) design to integrate a Thin Film Field Transistor (TFT) gate switching circuit on an array substrate of a display panel so as to implement scan driving of the display panel. Such a gate drive circuit, which is integrated on the array substrate with the GOA technology, is also referred to as a shift register. The shift register needs to provide a plurality of control signals for driving one row of pixel cells.

In the prior art, the shift register includes multiple stages of shift register units. However, only one control signal is provided per stage of shift register unit. It is required to cascade the multiple stages of shift register units in order to drive one row of pixel cells, which causes a complex structure of the shift register and a too large space occupied by the shift register.

SUMMARY

It is an object of the present disclosure to provide a shift register unit and a driving method thereof, a shift register and a display device, which may simplify the structure of the shift register and reduce the space occupied by the shift register.

In order to achieve the above object, the present disclosure provides technical solutions as follows:

In a first aspect, the present disclosure provides a shift register unit, comprising:

an input module, having a control terminal connected to an input signal terminal, an input terminal connected to a high level terminal, and an output terminal connected to a pull-up control node, the input module being configured to output a pull-up control signal at the pull-up control node under control of a signal of the input signal terminal;

a reset terminal, having a control terminal connected to a fifth stage output terminal, a first input terminal connected to an output terminal of the shift register unit, a second input terminal connected to the pull-up control node, and an output terminal connected to a low level terminal, the fifth stage output terminal being an output terminal of a corresponding fifth stage shift register unit in a case that the shift register unit is used as a first stage shift register unit, and the reset module being configured to reset the output terminal of the shift register unit and the pull-up control node;

a pull-down module, having a control terminal connected to a pull-down control node, a first input terminal connected to the output terminal of the shift register unit, a second input terminal connected to the pull-up control node, and an output terminal connected to the low level terminal, the pull-down module being configured to discharge the pull-up control node and the output terminal of the shift register unit;

an output pull-down control module, having a first control terminal connected to a pull-up control node, a second control terminal connected to the high level terminal, a third control terminal connected to the output terminal of the shift register unit, a first input terminal connected to the low level terminal, a first output terminal connected to the pull-down control node and a second output terminal connected to an output control node, the output pull-down control module being configured to provide a power supply enable signal and a power supply signal at the output control node;

an output control module, having a first control terminal connected to the pull-up control node, a first input terminal connected to a first clock signal terminal, a first output terminal connected to the output terminal of the shift register unit, a second control terminal connected to the output terminal of the shift register unit, a second input terminal connected to the high level terminal, a second output terminal connected to a gate drive signal terminal, a third control terminal connected to a fourth stage output terminal, a third input terminal connected to the gate drive signal terminal, a third output terminal connected to the low level terminal, a fourth control terminal connected to a second clock signal terminal, a fourth input terminal connected to the output control node, a fourth output terminal connected to a power supply signal terminal, a fifth control terminal connected to a third clock signal terminal, a fifth input terminal connected to the output control node, and a fifth output terminal connected to a power supply enable signal terminal, the fourth stage output terminal being an output terminal of a corresponding fourth shift register unit in the case that the shift register is used as the first stage shift register unit, and the output control module being configured to generate a gate drive signal and output the power supply enable signal, the power supply signal and the gate drive signal.

In a second aspect, the present disclosure provides a driving method of a shift register unit, comprising:

a first phase, in which the input module receives the high level signal of the input signal terminal, and charges the pull-up control node with the high level signal of the high-level terminal; the output control module receives the high level signal of the pull-up control node and the signal of the first clock signal terminal to provide a signal to the output terminal of the shift register unit, and outputs the gate drive signal at the gate drive signal terminal based on the signal of the output terminal of the shift register unit and the signal of the fourth stage output terminal; the output pull-down control module receives the signal of the output terminal of the shift register unit and the high level signal of the high level terminal to provide the power supply enable signal and the power supply signal at the output control node; the output control module receives the signal of the second clock signal terminal and the signal of the third clock signal terminal, and outputs the power supply enable signal and the power supply signal respectively at the power supply enable signal terminal and the power supply signal terminal; and a second phase, in which the reset module receives the high level signal of the fifth stage output terminal, and resets the output terminal of the shift register unit and the pull-up control node to the low level signal; the output pull-down control module receives the low level signal of the pull-up control node, and provides the high level signal to the pull-down control node; the pull-down module receives the high level signal of the pull-down control node, and discharges the pull-up control node and the output terminal of the shift register unit; the output control module receives the low level signal of the pull-up control node and the signal of the fourth stage output terminal, and outputs the low level signal at the gate drive signal terminal; the output pull-down control module receives the signal of the output terminal of the shift register unit and the high level signal of the high level terminal to provide a high level signal at the output control node; the output control module receives the signal of the second clock signal terminal and the signal of the third clock signal terminal, and outputs the power supply enable signal and the power supply signal, which are both high level signals, respectively at the power supply enable signal terminal and the power supply signal terminal.

In a third aspect, the present disclosure provides a shift register, comprising multiple cascaded stages of the shift register units in the above technical solutions, wherein an output terminal of a previous stage shift register unit is connected to an input signal terminal of a next stage shift register unit.

In a fourth aspect, the present disclosure provides a display device, comprising the shift register in the above technical solutions, wherein the power supply enable signal, the power supply signal and the gate drive signal provided by the shift register unit in the shift register are used for driving a pixel cell in the display device.

BRIEF DESCRIPTION OF THE DRAWINGS

The drawings described herein are provided to further understand the present disclosure, and constitute a part of the present disclosure. The exemplary embodiments of the present disclosure and the description thereof are intended to explain the present disclosure, and are not to be construed as inappropriate limitations on the present disclosure. In the drawings.

DETAILED DESCRIPTION

Hereinafter, the present disclosure will be described in detail with reference to the accompanying drawings, In order to further explain the shift register unit and the driving method thereof, the shift register and the display device provided by the embodiment of the present disclosure.

Figure 1:
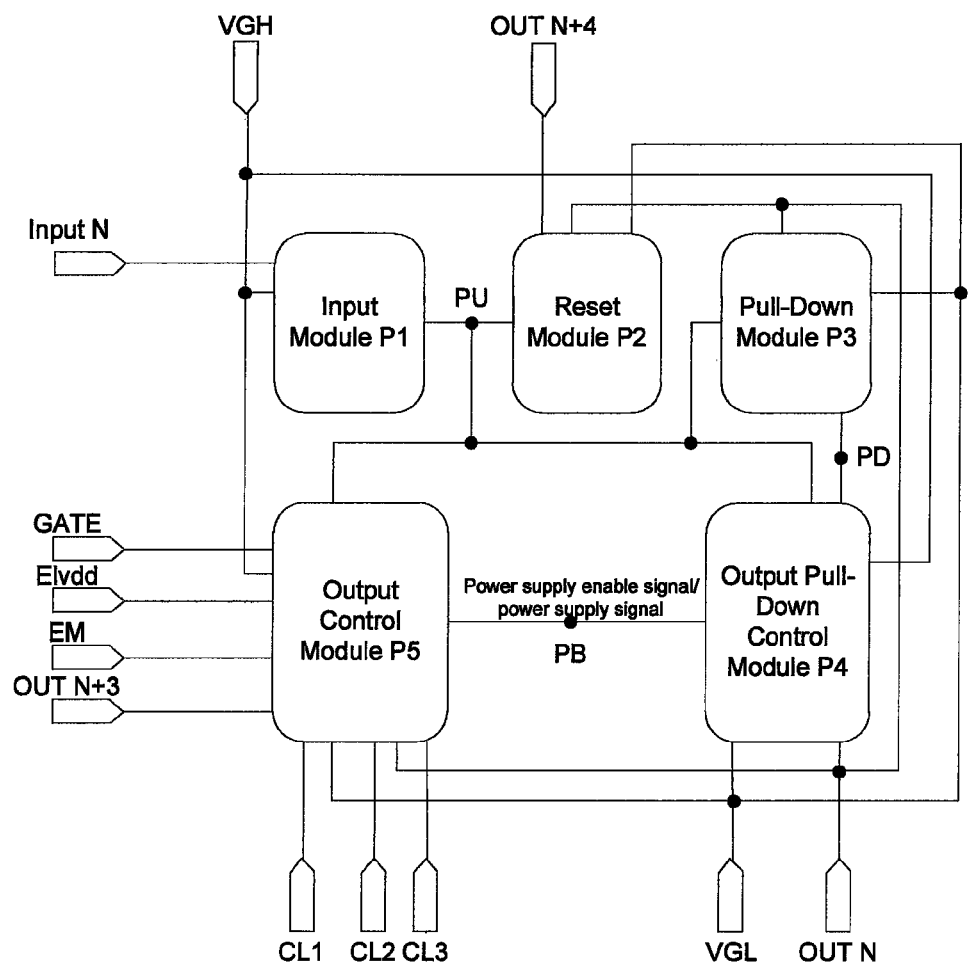
FIG. 1 is a schematic structure diagram of a shift register unit according to a first embodiment of the present disclosure.

With reference to FIG. 1, the shift register unit provided by the embodiment of the present disclosure includes an input module P1, a reset module P2, a pull-down module P3, an output pull-down control module P4, and an output control module P5. The N-th stage shift register unit in the shift register will be described below.

The input module P1 has a control terminal connected to an input signal terminal Input N, an input terminal connected to a high level terminal VGH, and an output terminal connected to a pull-up control node PU, the pull-up control node PU being an intersection point of the input module P1, the reset module P2, the pull-down module P3, the pull-down control module P4 and the output control module P5. The input module P1 is used for outputting a pull-up control signal at the pull-up control node under control of a signal of the input signal terminal Input N.

The reset module P2 has a control terminal connected to the fifth stage output terminal OUT N+4, a first input terminal connected to the output terminal OUT N of the shift register unit, a second input terminal connected to the pull-up control node PU, and an output terminal connected to a low level terminal VGL, wherein the fifth-stage output terminal OUT N+4 is an output terminal of a corresponding fifth stage shift register unit in the cascaded shift register units in a case that the current shift register unit is used as a first stage shift register unit. The reset module P2 is used for resetting the output terminal OUT N of the shift register unit and the pull-up control node.

The pull-down module P3 has a control terminal connected to a pull-down control node PD, a first input terminal connected to the output terminal OUT N of the shift register unit, a second input terminal connected to the pull-up control node PU, and an output terminal connected to the low level terminal VGL. The pull-down control node PD is an intersection point of the pull-down module P3 and the output pull-down control module P4. The pull-down module P3 is used for discharging the pull-up control node and the output terminal OUT N of the shift register unit.

The output pull-down control module P4 has a first control terminal connected to the pull-up control node PU, a second control terminal connected to the high level terminal VGH, a third control terminal connected to the output terminal OUT N of the shift register unit, a first input terminal connected to the low level terminal VGL, a first output terminal connected to the pull-down control node PD and a second output terminal connected to the output control node PB. The output control node PB is an intersection point of the output pull-down control module P4 and the output control module P5. The output pull-down control module P4 is used for generating and outputting a power supply enable signal and a power supply signal at the output control node PB.

The output control module P5 has a first control terminal connected to the pull-up control node PU, a first input terminal connected to a first clock signal terminal CL1, a first output terminal connected to the output terminal OUT N of the shift register unit, a second control terminal connected to the output terminal OUT N of the shift register unit, a second input terminal connected to the high level terminal VGH, a second output terminal connected to a gate drive signal terminal GATE, a third control terminal connected to a fourth stage output terminal OUT N+3, a third input terminal connected to the gate drive signal terminal GATE, a third output terminal connected to the low level terminal VGL, a fourth control terminal connected to a second clock signal terminal CL2, a fourth input terminal connected to the output control node PB, a fourth output terminal connected to a power supply signal terminal Elvdd, a fifth control terminal connected to a third clock signal terminal CL3, a fifth input terminal connected to the output control node PB, and a fifth output terminal connected to a power supply enable signal terminal EM, wherein the fourth stage output terminal OUT N+3 is an output terminal of a corresponding fourth shift register unit of the cascaded shift register units in the case that the current shift register is used as the first stage shift register unit. The output control module P5 is used for generating a gate drive signal and outputting the power supply enable signal at the power supply enable signal terminal EM, outputting the power supply signal at the power supply signal terminal Elvdd, and outputting the gate drive signal at the gate drive signal terminal GATE.

The shift register unit provided by the embodiment of the present disclosure includes the input module P1, the reset module P2, the pull-down module P3, the output pull-down control module P4, and the output control module P5, wherein the output pull-down control module P4 may provide the power supply enable signal and the power supply signal at the output control node PB, the output control module P5 may generate the gate drive signal, receive the power supply enable signal and the power supply signal provided by the output pull-down control module, and output, at its output terminal, the three control signals, i.e., the power supply enable signal, the power supply signal and the gate drive signal. Compared to the conventional shift register unit which may only output one control signal, the shift register unit according to the present disclosure may provide three control signals, i.e., the power supply enable signal, the power supply signal and the gate drive signal, simultaneously for driving the pixel cell, and thus may reduce the number of the shift register units required in the shift register under the premise of the pixel cell being able to be driven, thereby simplifying the structure of the shift register and reducing the space occupied by the shift register.

Hereinafter, a driving method of the shift register unit as discussed above will be described. The driving method of the shift register unit as discussed above may comprise two phases:

In a first phase, the input module P1 receives the high level signal of the input signal terminal Input N, and charges the pull-up control node PU with the high level signal of the high-level terminal VGH; the output control module P5 receives the high level signal of the pull-up control node PU and the signal of the first clock signal terminal CL1 to provide a signal to the output terminal OUT N of the shift register unit, and outputs the gate drive signal at the gate drive signal terminal GATE based on the signal of the output terminal OUT N of the shift register unit and the signal of the fourth stage output terminal OUT N+3; the output pull-down control module P4 receives the signal of the output terminal OUT N of the shift register unit and the high level signal of the high level terminal VGH to provide the power supply enable signal and the power supply signal at the output control node PB; the output control module P5 receives the signal of the second clock signal terminal CL2 and the signal of the third clock signal terminal CL3, and outputs the power supply enable signal and the power supply signal respectively at the power supply enable signal terminal EM and the power supply signal terminal Elvdd.

In a second phase, the reset module P2 receives the high level signal of the fifth stage output terminal OUT N+4, and resets the output terminal OUT N of the shift register unit and the pull-up control node PU to the low level signal; the output pull-down control module P4 receives the low level signal of the pull-up control node PU, and provides the high level signal to the pull-down control node PD; the pull-down module P3 receives the high level signal of the pull-down control node PD, and discharges the pull-up control node PU and the output terminal OUT N of the shift register unit; the output control module P5 receives the low level signal of the pull-up control node PU and the signal of the fourth stage output terminal OUT N+3, and outputs the low level signal at the gate drive signal terminal GATE; the output pull-down control module P4 receives the signal of the output terminal OUT N of the shift register unit and the high level signal of the high level terminal VGH to provide a high level signal at the output control node PB; the output control module P5 receives the signal of the second clock signal terminal CL2 and the signal of the third clock signal terminal CL3, and outputs the power supply enable signal and the power supply signal, which are both high level signals, respectively at the power supply enable signal terminal EM and the power supply signal terminal Elvdd.

The above driving method is applied to the shift register unit in the foregoing embodiment. The driving method of the shift register unit has the same advantages as those of the shift register unit, and thus description thereof is omitted for simplicity.

Figure 2:
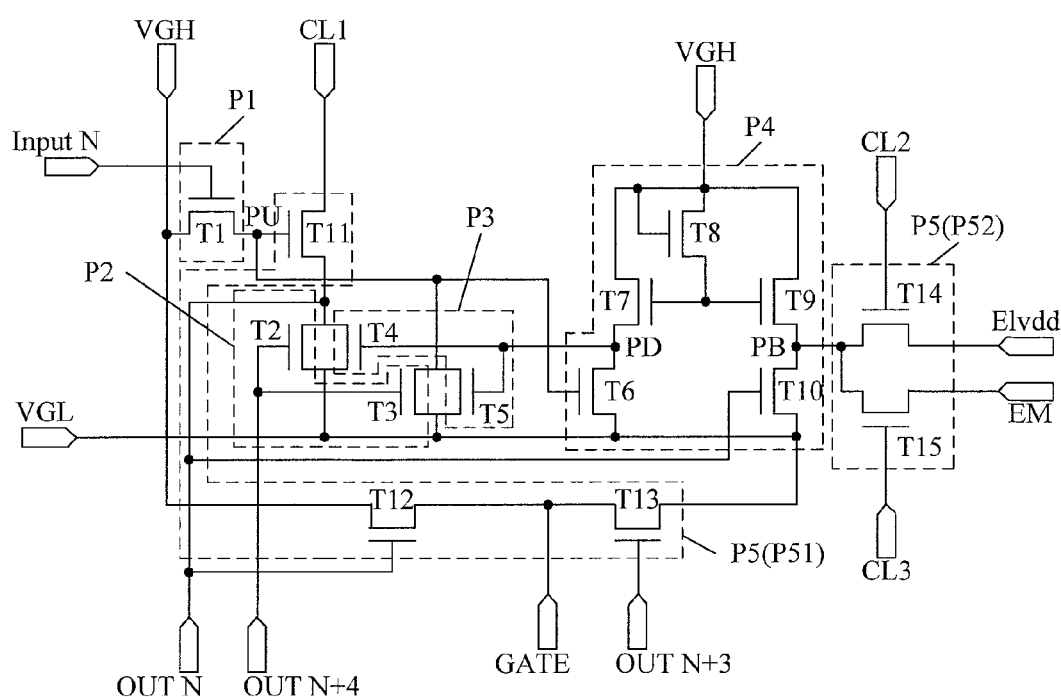
FIG. 2 is a schematic structure diagram of a shift register unit according to a second embodiment of the present disclosure.

With reference to FIG. 2, particular structures of the input module P1, the reset module P2, the pull-down module P3, the output pull-down control module P4 and the output control module P5 in the foregoing embodiment will be described in detail hereinafter. Of course, the structures of the input module P1, the reset module P2, the pull-down module P3, the output pull-down control module P4 and the output control module P5 according to the present disclosure are not limited to the embodiment as shown in FIG. 2, which is only illustrated as an example.

The input module P1 comprises a first transistor T1, having a gate connected to the input signal terminal Input N, a source connected to the high level terminal VGH, and a drain connected to the pull-up control node PU. In the present embodiment, the gate of the first transistor T1 corresponds to the control terminal of the input module, the source of the first transistor T1 corresponds to the input terminal of the input module, and the drain of the first transistor T1 corresponds to the output terminal of the input module.

The reset module P2 comprises a second transistor T2 and a third transistor T3; wherein the second transistor T2 has a gate connected to the fifth stage output terminal OUT N+4, a source connected to the output terminal OUT N of the shift register unit, and a drain connected to the low level terminal VGL; and the third transistor T3 has a gate connected to the fifth stage output terminal OUT N+4, a source connected to the pull-up control node PU, and a drain connected to the low level terminal VGL. In the present embodiment, the gate of the second transistor T2 and the gate of the third transistor T3 correspond to the control terminal of the reset module, the source of the second transistor T2 corresponds to the first input terminal of the reset module, the source of the third transistor T3 corresponds to the second input terminal of the reset module, and the drain of the second transistor T2 and the drain of the third transistor T3 correspond to the output terminal of the reset module.

The pull-down module P3 comprises a fourth transistor T4 and a fifth transistor T5, wherein the fourth transistor T4 has a gate connected to the pull-down control node PD, a source connected to the output terminal OUT N of the shift register unit, and a drain connected to the low level terminal VGL; and the fifth transistor T5 has a gate connected to the pull-down control node PD, a source connected to the pull-up control node PU, and a drain connected to the low-level terminal VGL. In the present embodiment, the gate of the fourth transistor T4 and the gate of the fifth transistor T5 correspond to the control terminal of the pull-down module, the source of the fourth transistor T4 corresponds to the first input terminal of the pull-down module, the source of the fifth transistor T5 corresponds to the second input terminal of the pull-down module, and the drain of the fourth transistor T4 and the drain of the fifth transistor T5 correspond to the output terminal of the pull-down module.

The output pull-down control module P4 comprises a sixth transistor T6, a seventh transistor T7, an eighth transistor T8, a ninth transistor T9 and a tenth transistor T10, wherein the sixth transistor T6 has a gate connected to the pull-up control node PU, a source connected to the pull-down control node PD, and a drain connected to the low level terminal VGL; the seventh transistor T7 has a gate connected to a drain of the eighth transistor T8 and a gate of the ninth transistor T9, a source connected to the high level terminal VGH, and a drain connected to the pull-down control node PD; the eighth transistor T8 has a gate connected to the high level terminal VGH, a source connected to the high level terminal VGH, and the drain connected to the gate of the ninth transistor T9; the ninth transistor T9 has the gate connected to the gate of the seventh transistor T7, a source connected to the high level terminal VGH, and a drain connected to the output control node PB; and the tenth transistor T10 has a gate connected to the output terminal OUT N of the shift register unit, a source connected to the output control node PB, and a drain connected to the low level terminal VGL.

The output control module P5 comprises a first output control sub-module P51 and a second output control sub-module P52, the first output control sub-module P51 being configured to output the gate drive signal, and the second output control sub-module P52 being configured to output the power supply enable signal and the power supply signal. In particular, the first output control sub-module P51 comprises an eleventh transistor T11, a twelfth transistor T12 and a thirteenth transistor T13, and the second output control sub-module P52 comprises a fourteenth transistor T14 and a fifteenth transistor T15, wherein the eleventh transistor T11 has a gate connected to the pull-up control node PU, a source connected to the first clock signal terminal CL1, and a drain connected to the output terminal OUT N of the shift register unit; the twelfth transistor T12 has a gate connected to the output terminal OUT N of the shift register unit, a source connected to the high level terminal VGH, and a drain connected to the gate drive signal terminal GATE; the thirteenth transistor T13 has a gate connected to the fourth stage output terminal OUT N+3, a source connected to the gate drive signal terminal GATE, and a drain connected to the low level terminal VGL; the fourteenth transistor T14 has a gate connected to the second clock signal terminal CL2, a source connected to the output control node PB, and a drain connected to the power supply signal terminal Elvdd; and the fifteenth transistor T15 has a gate connected to the third clock signal terminal CL3, a source connected to the output control node PB, and a drain connected to the power supply enable signal terminal EM. In the present embodiment, the gate of the eleventh transistor corresponds to the first control terminal of the output control module P5, the source of the eleventh transistor corresponds to the first input terminal of the output control module P5, the drain of the eleventh transistor corresponds to the first output terminal of the output control module P5; the gate of the twelfth transistor corresponds to the second control terminal of the output control module P5, the source of the twelfth transistor corresponds to the second input terminal of the output control module P5, the drain of the twelfth transistor corresponds to the second output terminal of the output control module P5; the gate of the thirteenth transistor corresponds to the third control terminal of the output control module P5, the source of the thirteenth transistor corresponds to the third input terminal of the output control module P5, the drain of the thirteenth transistor corresponds to the third output terminal of the output control module P5; the gate of the fourteenth transistor corresponds to the fourth control terminal of the output control module P5, the source of the fourteenth transistor corresponds to the fourth input terminal of the output control module P5, the drain of the fourteenth transistor corresponds to the fourth output terminal of the output control module P5; and the gate of the fifteenth transistor corresponds to the fifth control terminal of the output control module P5, the source of the fifteenth transistor corresponds to the fifth input terminal of the output control module P5, the drain of the fifteenth transistor corresponds to the fifth output terminal of the output control module P5.

Particular connections between the particular structures of the input module P1, the reset module P2, the pull-down module P3, the output pull-down control module P4 and the output control module P5 are described as follows. The source of the first transistor T1 is connected to the source of the twelfth transistor T12; and the drain of the first transistor T1 is connected to the gate of the eleventh transistor T11, the source of the third transistor T3, the source of the fifth transistor T5, and the gate of the sixth transistor T6; the source of the second transistor T2 is connected to the drain of the eleventh transistor T11, the gate of the twelfth transistor T12, the source of the fourth transistor T4, and the gate of the tenth transistor T10; and the drain of the second transistor T2 is connected to the drain of the fourth transistor T4, the drain of the fifth transistor T5, the drain of the sixth transistor T6, the drain of the tenth transistor T10, and the drain of the thirteenth transistor T13; the source of the third transistor T3 is connected to the source of the fifth transistor T5, the gate of the eleventh transistor T11 and the gate of the sixth transistor T6; and the drain of the third transistor T3 is connected to the drain of the fifth transistor T5, the drain of the fourth transistor T4, the drain of the sixth transistor T6, the drain of the tenth transistor T10, and the drain of the thirteenth transistor T13; the gate of the fourth transistor T4 is connected to the source of the sixth transistor T6 and the drain of the seventh transistor T7; the source of the fourth transistor T4 is connected to the drain of the eleventh transistor T11, the gate of the twelfth transistor T12, and the gate of the tenth transistor T10; and the drain of the fourth transistor T4 is connected to the drain of the sixth transistor T6, the drain of the tenth transistor T10, and the drain of the thirteenth transistor T13; the gate of the fifth transistor T5 is connected to the source of the sixth transistor T6 and the drain of the seventh transistor T7; the source of the fifth transistor T5 is connected to the gate of the eleventh transistor T11 and the gate of the sixth transistor T6; and the drain of the fifth transistor T5 is connected to the drain of the sixth transistor T6, the drain of the tenth transistor T10, and the drain of the thirteenth transistor T13; the gate of the sixth transistor T6 is connected to the gate of the eleventh transistor T11; and the drain of the sixth transistor T6 is connected to the drain of the thirteenth transistor T13; the drain of the ninth transistor T9 is connected to the source of the fourteenth transistor T14 and the source of the fifteenth transistor T15; and the gate of the tenth transistor T10 is connected to the gate of the twelfth transistor T12, the source of the tenth transistor T10 is connected to the source of the fourteenth transistor T14 and the source of the fifteenth transistor T15, and the drain of the tenth transistor T10 is connected to the drain of the thirteenth transistor T13. It should be noted that the pull-up control node PU may particularly be an intersection point of the drain of the first transistor T1 and the gate of the eleventh transistor T11, the pull-down control node PD may particularly be an intersection point of the source of the sixth transistor T6 and the gate of the seventh transistor T7, and the output control mode PB may particularly be an intersection point of the drain of the ninth transistor T9 and the source of the tenth transistor T10.

The respective transistors in the present embodiment are P-type transistors, which are only illustrated as an example. It should be noted that the respective transistors may also be N-type transistors, and a circuit design in which the transistors are N-type transistors also falls into the protection scope of the present disclosure. In this alternative embodiment, connections of the respective transistors are identical with those in the above embodiment, except that the connections of the respective input terminals and the output terminals are switched. For example, the gate of the first transistor corresponds to the control terminal of the input module, the drain of the first transistor corresponds to the input terminal of the input module, and the source of the first transistor corresponds to the output terminal of the input module.

Figure 3:
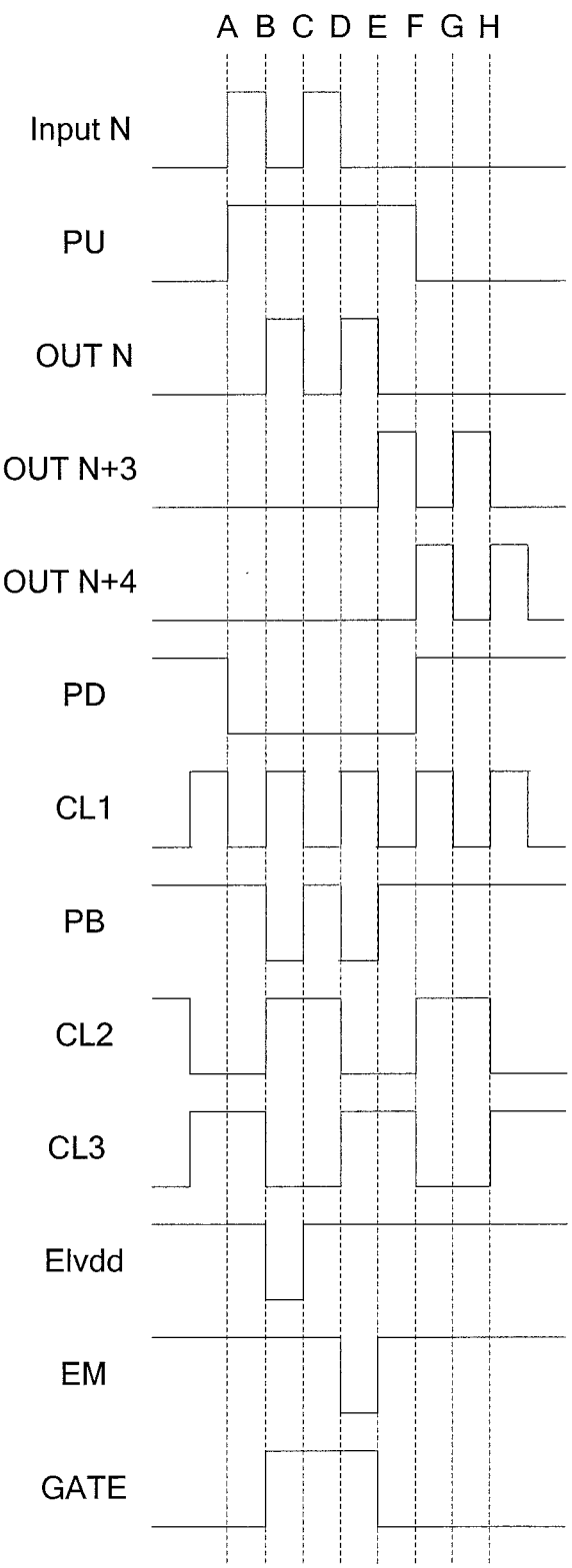
FIG. 3 is a signal timing sequence diagram of the shift register unit in FIG. 2.

With reference to FIG. 3, FIG. 3 shows a signal timing sequence diagram of the shift register unit as shown in FIG. 2. Hereinafter, the driving method of the shift register unit in the embodiment described in conjunction with FIG. 2 will be described with reference to FIG. 3 by taking P-type transistors as an example of the respective transistors. It should be noted that the first phase of the driving method of the shift register unit in the embodiment according to the present disclosure includes an A-B phase, a B-C phase, a C-D phase, a D-E phase and an E-F phase, and the second phase includes an F-G phase and a G-H phase.

In the A-B phase, the signal of the input signal terminal Input N is a high level signal, the gate of the first transistor T1 receives the high level signal of the input signal terminal Input N, the first transistor T1 is turned on to charge the pull-up control node PU, and thus a signal of the pull-up control node PU is a high level signal; the gate of the eleventh transistor T11 receives the high level signal of the pull-up control node PU, the eleventh transistor T11 is turned on, the signal of the first clock signal terminal CL1 is a low level signal, the signal of the output terminal OUT N of the shift register unit is a low level signal, the twelfth transistor T12 is turned off, and the signal of the gate drive signal terminal GATE is a low level signal; the signal of the pull-up control node PU is a high level signal, the sixth transistor T6 is turned on, the signal of the pull-down signal control node PD is a low level signal, and both the fourth transistor T4 and the fifth transistor T5 are turned off; the gate of the tenth transistor T10 receives the low level signal of the output OUT N of the shift register unit, the tenth transistor T10 is turned off, and thus the signal of the output control node PB is a high level signal; the signal of the second clock signal terminal CL2 is a low level signal, the fourteenth transistor T14 is turned off, and the signal of the power supply signal terminal Elvdd is a high level signal; the signal of the third clock signal terminal CL3 is a high level signal, the fifteenth transistor T15 is turned on, and the signal of the power supply enable signal terminal EM is a high level signal.

In the B-C phase, the signal of the input signal terminal Input N is a low level signal, the first transistor T1 is turned off, and the pull-up control node PU keeps the high level signal in the A-B phase; the eleventh transistor T11 is turned on, the signal of the first clock signal terminal CL1 is a high-level signal, the signal of the output terminal OUT N of the shift register unit is a high-level signal, the gate of the twelfth transistor T12 receives the high level signal of the high level terminal VGH through the twelfth transistor T12, and outputs the gate drive signal which is a high level signal; the signal of the pull-up control node PU is a high level signal, the sixth transistor T6 is turned on, the signal of the pull-down control node PD is a low level signal, the fourth transistor T4 and the fifth transistor T5 still remain in the turn-off state; the gate of the tenth transistor T10 receives the high level signal of the output terminal OUT N of the shift register unit, the tenth transistor T10 is turned on, and the signal of the output control node PB is a low-level signal; the signal of the second clock signal terminal CL2 is a high-level signal, the fourteenth transistor T14 is turned on, and the power supply signal is output at the power supply signal terminal Elvdd, the power supply power supply signal being a low level signal; the signal of the third clock signal terminal CL3 is a low level signal, the fifteenth transistor T15 is turned off, and the signal of the power supply enable signal terminal EM is kept as the high level signal.

In the C-D phase, the signal of the input signal terminal Input N is a high level signal, the first transistor T1 is turned on for charging the pull-up control node PU, the signal of the pull-up control node PU being a high level signal; the eleventh transistor T11 is turned on, the signal of the first clock signal terminal CL1 is a low level signal, the signal of the output terminal OUT N of the shift register unit is a low level signal, the twelfth transistor T12 is turned off, and the signal of the gate drive signal terminal GATE is kept as the high level signal in the B-C phase, i.e., the gate drive signal terminal GATE continues to output the gate drive signal; the signal of the pull-up control node PU is a high level signal, the sixth transistor T6 is turned on, the signal of the pull-down control node PD is a low level signal, both the fourth transistor T4 and the fifth transistor T5 are turned off; the gate of the tenth transistor T10 receives the low level signal of the output terminal OUT N of the shift register unit, the tenth transistor T10 is turned off, and thus the signal of the output control node PB is a high level signal; the signal of the second clock signal terminal CL2 is a high level signal, the fourteenth transistor T14 is turned on, and the signal of the power supply signal terminal Elvdd is a high level signal; the signal of the third clock signal terminal CL3 is a low level signal, the fifteenth transistor T15 is turned off, and the signal of the power supply enable signal terminal EM is kept as the high level signal.

In the D-E phase, the signal of the input signal terminal Input N is a low level signal, the first transistor T1 is turned off, the pull-up control node PU keeps the high level signal in the C-D phase, the eleventh transistor T11 is turned on, and the signal of the first clock signal terminal CL1 is a high level signal, the signal of the output terminal OUT N of the shift register unit is a high level signal, the gate of the twelfth transistor T12 receives the high level signal of the output terminal OUT N of the shift register unit, the twelfth transistor T12 is turned on, the gate drive signal terminal GATE receives the high level signal of the high level terminal VGH through the twelfth transistor T12, and outputs the gate drive signal, the gate drive signal being a high level signal; the signal of the pull-up control node PU is a high level signal, the sixth transistor T6 is turned on, the signal of the pull-down control node PD is a low level signal, the fourth transistor T4 and the fifth transistor T5 still remain in the turn-off state; the gate of the tenth transistor T10 receives the high level signal of the output terminal OUT N of the shift register unit, the tenth transistor T10 is turned on, and the signal of the output control node PB is a low level signal; the signal of the second clock signal terminal CL2 is a low level signal, the fourteenth transistor T14 is turned off, and the signal of the power supply signal terminal Elvdd is a high level signal; the signal of the third clock signal terminal CL3 signal is a high level signal, the fifteenth transistor T15 is turned on, the power supply enable signal terminal EM outputs the power supply enable signal which is a low level signal.

In the E-F phase, the signal of the input signal terminal Input N is a low level signal, the first transistor T1 is turned off, the pull-up control node PU keeps the high level signal in the D-E phase, the eleventh transistor T11 is turned on, the signal of the first clock signal terminal CL1 is a low Level signal, the signal of the output terminal OUT N of the shift register unit is a low level signal, and the twelfth transistor T12 is turned off; the signal of the fourth stage output terminal OUT N+3 is a high level signal, the thirteenth transistor T13 is turned on, and the signal of the gate drive signal terminal GATE is a low level signal; the signal of the pull-up control node PU is a high level signal, the sixth transistor T6 is turned on, the signal of the pull-down control node PD is a low level signal, and both the four transistors T4 and the fifth transistor T5 are turned off; the gate of the tenth transistor T10 receives the low level signal of the output terminal OUT N of the shift register unit, the tenth transistor T10 is turned off, and thus the signal of the output control node PB is a high level signal; the signal of the second clock signal terminal CL2 is a low level signal, the fourteenth transistor T14 is turned off, and the signal of the power supply signal terminal Elvdd is a high level signal; the signal of the third clock signal terminal CL3 is a high Level signal, the fifteenth transistor T15 is turned on, and the signal of the power supply enable signal terminal EM is a high level signal.

In the F-G phase, the signal of the input signal terminal Input N is a low level signal, and the first transistor T1 is turned off; the signal of the fifth stage output terminal OUT N+4 is a high level signal, both the second transistor T2 and the third transistor T3 are turned on, the output terminal OUT N of the shift register unit is discharged by the second transistor T2, the output terminal OUT N of the shift register unit is reset to the low level signal, the pull-up control node PU is discharged by the third transistor T3, the pull-up control node PU is reset to the low-level signal; the gate of the sixth transistor T6 receives the low-level signal of the pull-up control node PU, the sixth transistor T6 is turned off, and thus the signal of the pull-down control node PD is a high level signal; the gate of the fourth transistor T4 and the gate of the fifth transistor T5 receive the high level signal of the pull-down control node PD, both the fourth transistor T4 and the fifth transistor T5 are turned on, the fourth transistor T4 further discharges the output terminal OUT N of the shift register unit, and the fifth transistor T5 further discharges the pull-up control node PU; the signal of the output terminal OUT N of the shift register unit is a low level signal, the tenth transistor is turned off, and the signal of the output control node PB is a high level signal; the signal of the second clock signal terminal CL2 is a high level signal, the fourteenth transistor T14 is turned on, the signal of the power supply signal terminal Elvdd is a high level signal; the signal of the third clock signal terminal CL3 is a low level signal, the fifteenth transistor T15 is turned off, and the signal of the power supply enable signal terminal EM is a high level signal.

In the G-H phase, the signal of the input signal terminal Input N is a low level signal, and the first transistor T1 is turned off; the signal of the fifth stage output terminal OUT N+4 is a low level signal, both the second transistor T2 and the third transistor T3 are turned off, the output terminal OUT N of the shift register unit keeps the low level signal in the F-G phase, and the pull-up control node PU keeps the low level signal in the F-G phase; the gate of the sixth transistor T6 receives the low level signal of the pull-up control node PU, the sixth transistor T6 is turned off, and thus the signal of the pull-down control signal PD is a high level signal; the gate of the fourth transistor T4 and the gate of the fifth transistor T5 receive the high level signal of the pull-down control node PD, both the fourth transistor T4 and the fifth transistor T5 are turned on, the fourth transistor T4 further discharges the output terminal OUT N of the shift register unit, and the fifth transistor T5 further discharges the pull-up control node PU; the signal of the output terminal OUT of the shift register unit N is a low level signal, the tenth transistor T10 is turned off, and the signal of the output control node PB is a high level signal; the signal of the second clock signal terminal CL2 is a high level signal, the fourteenth transistor T14 is turned on, and the signal of the power supply signal terminal Elvdd is a high level signal; the signal of the third clock signal terminal CL3 is a low level signal, the fifteenth transistor T15 is turned off, and the signal of the power supply enable signal terminal EM is a high level signal.

In the A-H phase, the seventh transistor T7, the eighth transistor T8 and the ninth transistor T9 are all kept turn-on, wherein the output of the eighth transistor T8 is high, controlling the seventh transistor T7 and the ninth transistor T9 to be turned on, thereby writing the high level signals in the PD node and the PB node respectively.

Although FIG. 2 shows that both the gate and the source of the eighth transistor T8 are connected to the high level terminal VGH, they may be connected to the inverted signal of the first clock signal CL1 to ensure that the PU node becomes high before the PU node, so that the PD node may be discharged by the PU node when the PU node is high.

It should be noted that the signal of the second clock signal terminal CL2 and the signal of the third clock signal terminal CL3 are mutually inverted signals, and a frequency of the signal of the first clock signal terminal CL1 is different from a frequency of the signal of the second clock signal terminal CL2. Preferably, the frequency of the signal of the first clock signal terminal CL1 is twice the frequency of the signal of the second clock signal terminal CL2.

Figure 4:
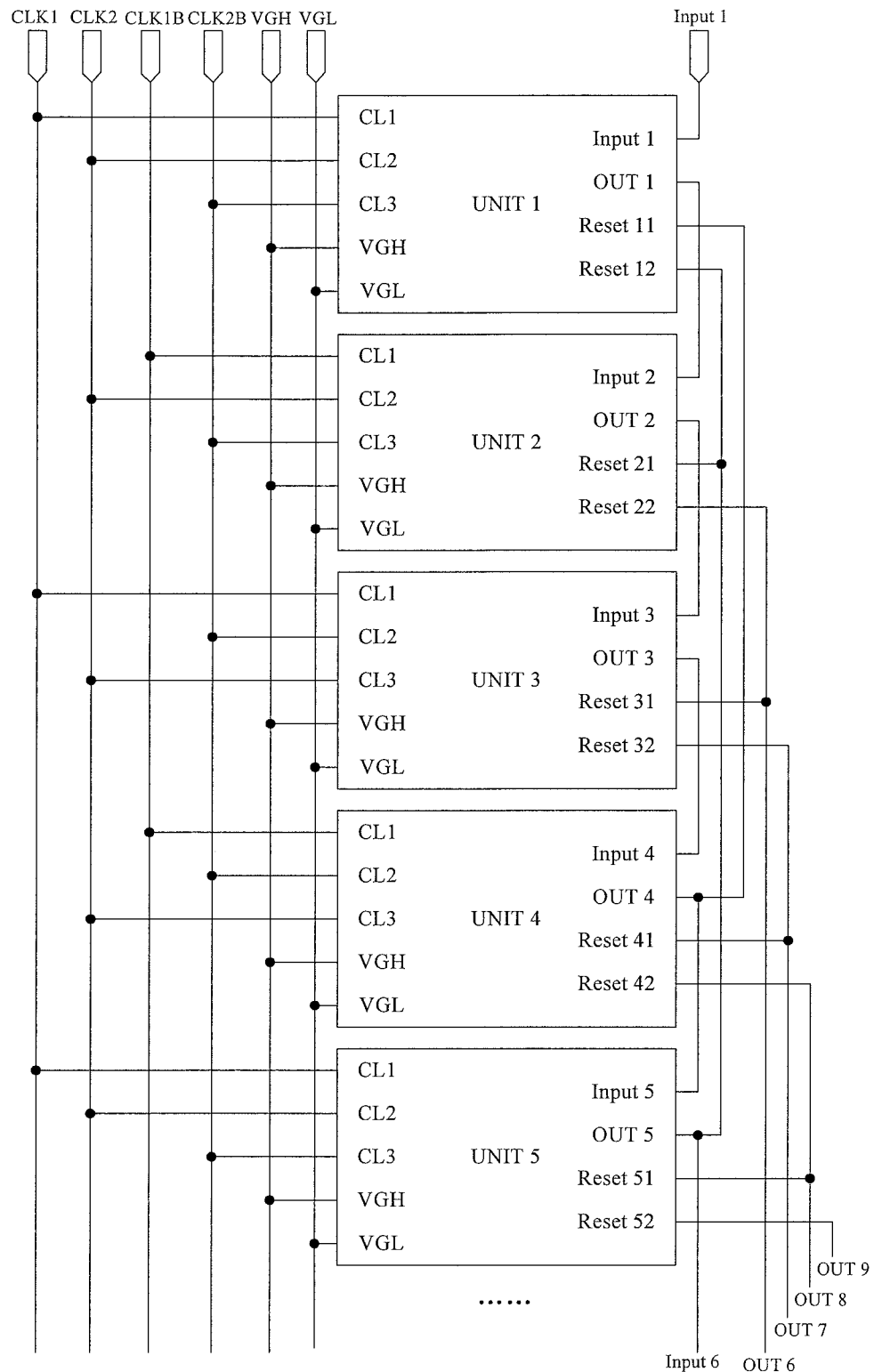
FIG. 4 is a schematic structure diagram of a shift register unit according to a third embodiment of the present disclosure.

With reference to FIG. 4, the present disclosure further provides a shift register, which comprises multiple stages of the shift register units as previously described in the embodiments according to the present disclosure, wherein the output terminal of a previous stage of shift register unit is connected to an input signal terminal of a next stage of shift register unit. For example, a current output terminal OUT 1 of the first stage of shift register unit UNIT1 is connected to an input signal terminal Input 2 of the second stage of shift register unit UNIT2, as shown in FIG. 4.

Further, the shift register comprises N stages of the shift register units as previously described in the embodiments according to the present disclosure, N being an integer no less than 4; wherein both the first clock signal terminal CL1 of an i-th stage shift register unit and the first clock signal terminal CL1 of an (i+2)-th stage shift register unit input the first clock signal, and both the first clock signal terminal CL1 of an (i+1)-th stage shift register unit and the first clock signal terminal CL1 of an (i+3)-th stage shift register unit input the inverted signal of the first clock signal; both the second clock signal terminal CL2 of the i-th stage shift register unit and the second clock signal terminal of the (i+1)-th stage shift register unit input the second clock signal, and both the second clock signal terminal of the (i+2)-th stage shift register unit and the second clock signal terminal of the (i+3)-th stage shift register unit input the inverted signal of the second clock signal; and both the third clock signal terminal of the i-th stage shift register unit and the third clock signal terminal of the (i+1)-th stage shift register unit input the inverted signal of the second clock signal, and both the third clock signal terminal of the (i+2)-th stage shift register unit and the third clock signal terminal of the (i+3)-th stage shift register unit input the second clock signal, where i is an integer, i≥1 and (i+3)≤N. For example, as shown in FIG. 4, a first clock signal terminal CL1 of the first stage of shift register unit UNIT1 inputs a first clock signal CLK1, a second clock signal terminal CL2 inputs a second clock signal CLK2, a third clock signal terminal CL3 inputs an inverted signal CLK2B of the second clock signal, a first reset terminal Reset 11 is connected to an output terminal OUT4 of the fourth stage of shift register unit, and a second reset terminal Reset 12 is connected to an output terminal OUT5 of the fifth stage of shift register unit; a first clock signal terminal CL1 of the second stage of shift register unit UNIT2 inputs an inverted signal CLK1B of the first clock signal, a second clock signal terminal CL2 inputs the second clock signal CLK2, a third clock signal terminal CL3 inputs the inverted signal CLK2B of the second clock signal, a first reset terminal Reset 21 is connected to the output terminal OUT5 of the fifth stage of shift register unit, and a second reset terminal Reset 22 is connected to an output terminal OUT6 of the sixth stage of shift register unit; a first clock signal terminal CL1 of the third stage of shift register unit UNIT3 inputs the first clock signal CLK1, a second clock signal terminal CL2 inputs the inverted signal CLK2B of the second clock signal, a third clock signal terminal CL3 inputs the second clock signal CLK2, a first reset terminal Reset 31 is connected to the output terminal OUT6 of the sixth stage of shift register unit, and a second reset terminal Reset 32 is connected to an output terminal OUT7 of the seventh stage of shift register unit; a first clock signal terminal CL1 of the fourth stage of shift register unit UNIT4 inputs the inverted signal CLK1B of the first clock signal, a second clock signal terminal CL2 inputs the inverted signal CLK2B of the second clock signal, a third clock signal terminal CL3 inputs the second clock signal CLK2, a first reset terminal Reset 41 is connected to the output terminal OUT7 of the seventh stage of shift register unit, and a second reset terminal Reset 42 is connected to an output terminal OUT8 of the eighth stage of shift register unit; a first clock signal terminal CL1 of the fifth stage of shift register unit UNIT5 inputs the first clock signal CLK1, a second clock signal terminal CL2 inputs the second clock signal CLK2, a third clock signal terminal CL3 inputs the inverted signal CLK2B of the second clock signal, a first reset terminal Reset 51 is connected to the output terminal OUT8 of the eighth stage of shift register unit, and a second reset terminal Reset 52 is connected to an output terminal OUT9 of the ninth stage of shift register unit; and the connection relationships of the remaining stages of shift register units are so on.

Connections of the gate drive signal terminal, the power supply enable signal terminal and the power supply signal terminal of the respective stages of shift register units are not shown in FIG. 4. Obviously, the gate drive signals, the power supply enable signals and the power supply signals output by the respective stages of shift register units are used for driving corresponding rows of pixel cells. That is, the gate drive signal terminal, the power supply enable signal terminal and the power supply power terminal of each stage of shift register unit are connected to terminals of the corresponding pixel cell.

It should be noted that the shift register units in the shift register have the same advantages as those of the shift register unit in the above embodiments, and thus description thereof is omitted for simplicity.

Figure 5:
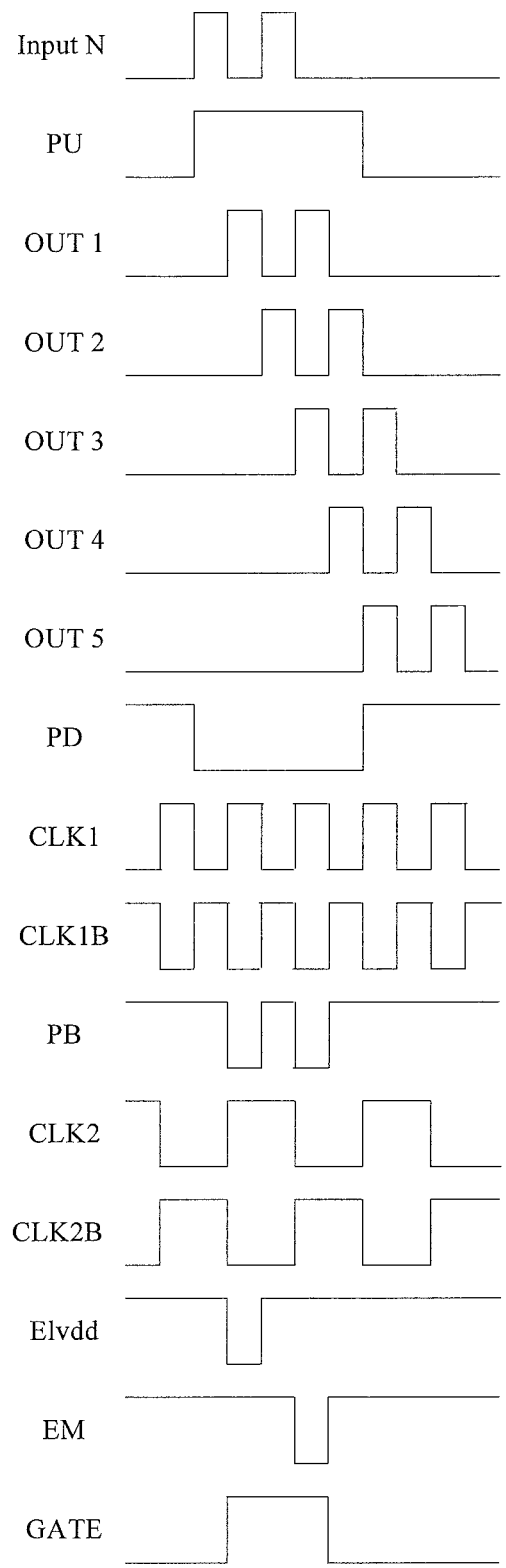
FIG. 5 is a signal timing sequence diagram of the shift register unit in FIG. 4.

With reference to FIG. 5, FIG. 5 shows a signal timing sequence diagram of the shift register in the embodiment according to the present disclosure. A particular driving method of the shift register may refer to the driving method of the shift register units which constitute the shift register. Illustration of the signal timing sequence diagram in FIG. 5 may also refer to that of the signal timing sequence diagram in FIG. 3.

Figure 6:
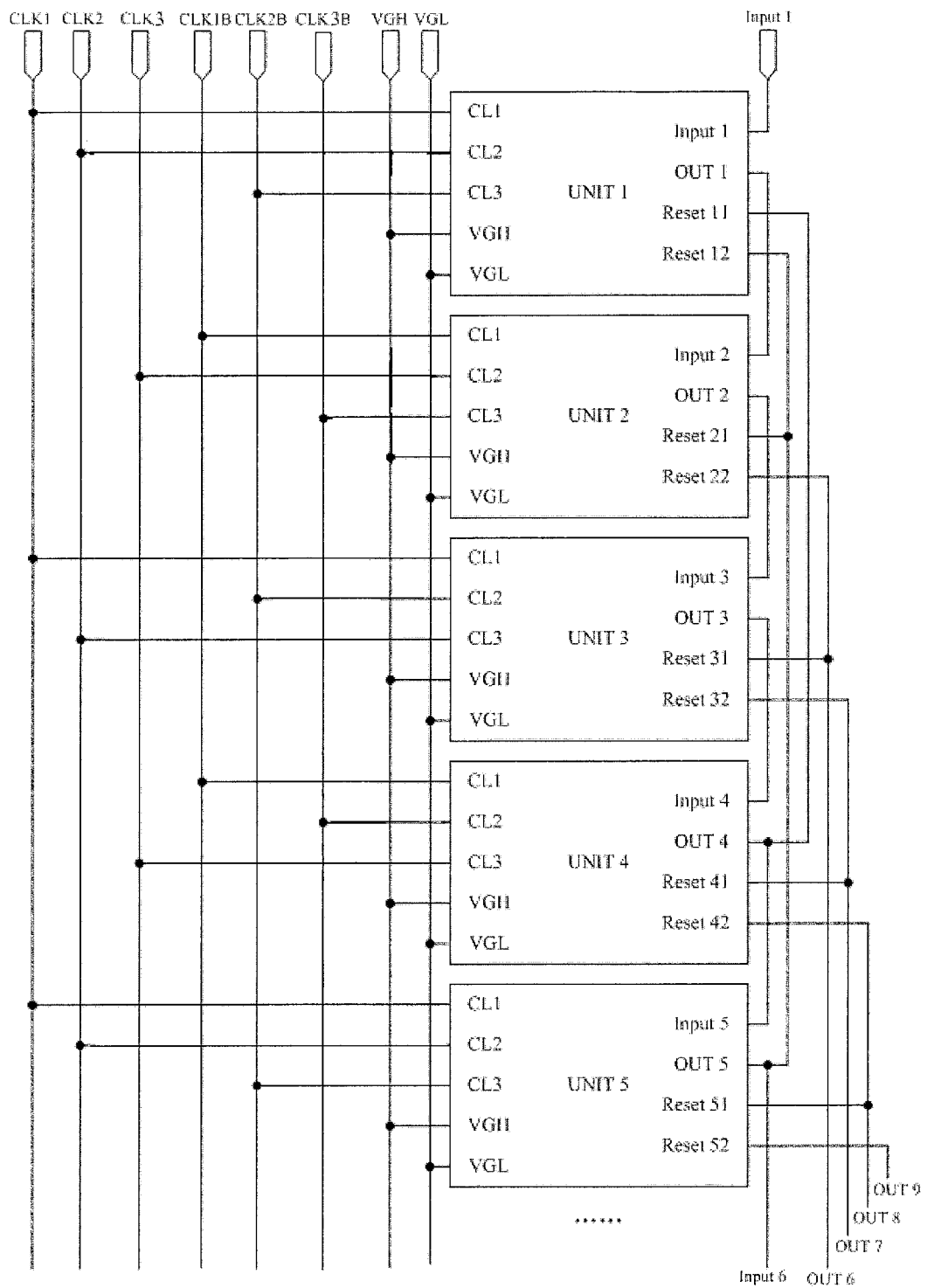
FIG. 6 is a schematic structure diagram of a shift register according to another embodiment of the present disclosure.

Of course, considering the charging and discharging of the transistors, a third clock signal, which has a hysteresis with respect to the second clock signal (e.g., is delayed by a half of a clock cycle with respect to the second clock signal), may be provided in order to ensure the timings of driving the respective shift register units. In the embodiment where the shift register comprises N stages of shift register units, N being an integer no less than 4, both the first clock signal terminal CL1 of the i-th stage shift register unit and the first clock signal terminal CL1 of the (i+2)-th stage shift register unit input the first clock signal, and both the first clock signal terminal CL1 of the (i+1)-th stage shift register unit and the first clock signal terminal CL1 of the (i+3)-th stage shift register unit input the inverted signal of the first clock signal; the second clock signal terminal CL2 of the i-th stage shift register unit inputs the second clock signal, the second clock signal terminal CL2 of the (i+1)-th stage shift register unit inputs the third clock signal, the second clock signal terminal CL2 of the (i+2)-th stage shift register unit inputs the inverted signal of the second clock signal, and the second clock signal terminal of the (i+3)-th stage shift register unit inputs the inverted signal of the second clock signal; the third clock signal terminal CL3 of the i-th stage shift register unit inputs the inverted signal of the second clock signal, the third clock signal terminal CL3 of the (i+1)-th stage shift register unit inputs the inverted signal of the third clock signal, the third clock signal terminal CL3 of the (i+2)-th stage shift register unit inputs the second clock signal, and the third clock signal terminal CL3 of the (i+3)-th stage shift register unit inputs the third clock signal, where i is an integer, i≥1 and (i+3)≤N. For example, as shown in FIG. 6, a first clock signal terminal CL1 of the first stage of shift register unit UNIT1 inputs a first clock signal CLK1, a second clock signal terminal CL2 inputs a second clock signal CLK2, a third clock signal terminal CL3 inputs an inverted signal CLK2B of the second clock signal, a first reset terminal Reset 11 is connected to an output terminal OUT4 of the fourth stage of shift register unit, and a second reset terminal Reset 12 is connected to an output terminal OUT5 of the fifth stage of shift register unit; a first clock signal terminal CL1 of the second stage of shift register unit UNIT2 inputs an inverted signal CLK1B of the first clock signal, a second clock signal terminal CL2 inputs the third clock signal CLK3, a third clock signal terminal CL3 inputs an inverted signal CLK3B of the third clock signal, a first reset terminal Reset 21 is connected to the output terminal OUT5 of the fifth stage of shift register unit, and a second reset terminal Reset 22 is connected to an output terminal OUT6 of the sixth stage of shift register unit; a first clock signal terminal CL1 of the third stage of shift register unit UNIT3 inputs the first clock signal CLK1, a second clock signal terminal CL2 inputs the inverted signal CLK2B of the second clock signal, a third clock signal terminal CL3 inputs the second clock signal CLK2, a first reset terminal Reset 31 is connected to the output terminal OUT6 of the sixth stage of shift register unit, and a second reset terminal Reset 32 is connected to an output terminal OUT7 of the seventh stage of shift register unit; a first clock signal terminal CL1 of the fourth stage of shift register unit UNIT4 inputs the inverted signal CLK1B of the first clock signal, a second clock signal terminal CL2 inputs the inverted signal CLK3B of the third clock signal, a third clock signal terminal CL3 inputs the third clock signal CLK3, a first reset terminal Reset 41 is connected to the output terminal OUT7 of the seventh stage of shift register unit, and a second reset terminal Reset 42 is connected to an output terminal OUT8 of the eighth stage of shift register unit; a first clock signal terminal CL1 of the fifth stage of shift register unit UNIT5 inputs the first clock signal CLK1, a second clock signal terminal CL2 inputs the second clock signal CLK2, a third clock signal terminal CL3 inputs the inverted signal CLK2B of the second clock signal, a first reset terminal Reset 51 is connected to the output terminal OUT8 of the eighth stage of shift register unit, and a second reset terminal Reset 52 is connected to an output terminal OUT9 of the ninth stage of shift register unit; and the connection relationships of the remaining stages of shift register units are so on.

Figure 7:
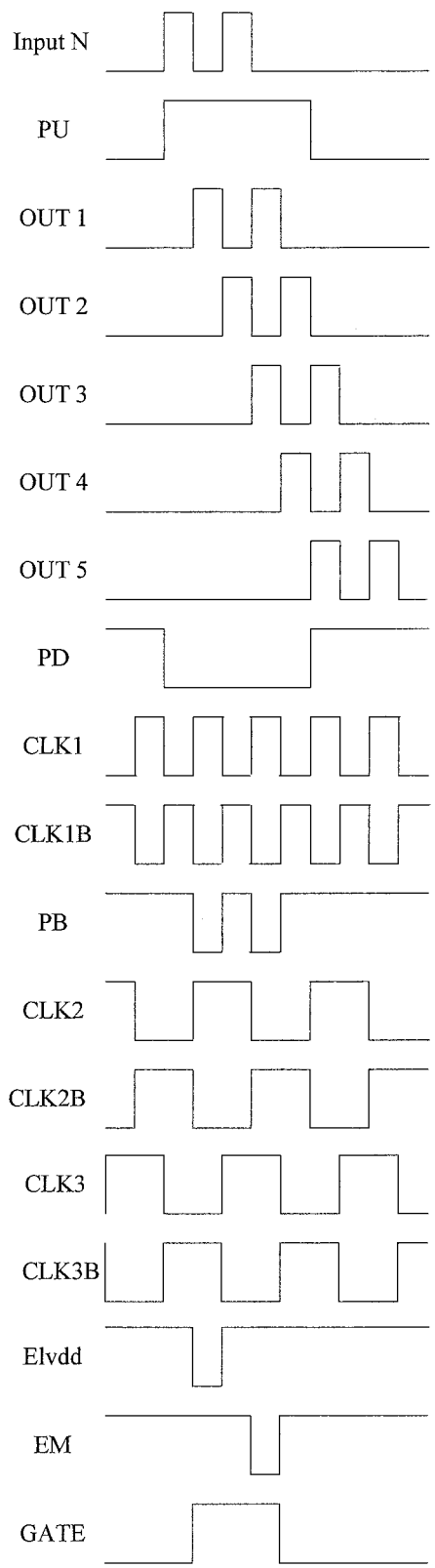
FIG. 7 is a signal timing sequence diagram of the shift register in FIG. 6.

FIG. 7 shows a signal timing sequence diagram of the shift register in the present embodiment. A particular driving method of the shift register may refer to the driving method of the shift register units which constitute the shift register. Illustration of the signal timing sequence diagram in FIG. 7 may also refer to that of the signal timing sequence diagram in FIG. 3.

The present disclosure further provides a display device. The display device comprises the shift register in the above third embodiment, wherein the power supply enable signal, the power supply signal and the gate drive signal provided by the shift register unit in the shift register are used for driving the pixel cells in the display device. The shift register in the display device has the same advantages as that in the above embodiments, and thus description thereof is omitted for simplicity. In particular, the display device may be an organic light-emitting diode display panel, an e-paper, a mobile phone, a tablet, a TV, a display, a notebook, a digital photo frame, a navigator, and any other products or components having a display function.

The respective embodiments in the specification are all described in a progressive manner, the same or similar parts of the respective embodiments may be referred to from each other, and each embodiment focuses on difference from other embodiments. For the driving method embodiments, since it is applied to the product embodiments, related parts of the driving method embodiments may refer to the related description of the product embodiments.

It may be understood that the above implementations are only exemplary implementations for illustrating the principles of the present disclosure, but the present disclosure is not limited to these. For the skilled in the art, various variations and improvements may be made without being apart from the sprit and substance of the present disclosure, which also fall into the protection scope of the present disclosure.

I claim:

1. A shift register unit, comprising:
an input module, having a control terminal connected to an input signal terminal, an input terminal connected to a high level terminal, and an output terminal connected to a pull-up control node, the input module being configured to output a pull-up control signal at the pull-up control node under control of a signal of the input signal terminal;
a reset terminal, having a control terminal connected to a fifth stage output terminal, a first input terminal connected to an output terminal of the shift register unit, a second input terminal connected to the pull-up control node, and an output terminal connected to a low level terminal, the fifth stage output terminal being an output terminal of a corresponding fifth stage shift register unit in a case that the shift register unit is used as a first stage shift register unit, and the reset module being configured to reset the output terminal of the shift register unit and the pull-up control node;
a pull-down module, having a control terminal connected to a pull-down control node, a first input terminal connected to the output terminal of the shift register unit, a second input terminal connected to the pull-up control node, and an output terminal connected to the low level terminal, the pull-down module being configured to discharge the pull-up control node and the output terminal of the shift register unit;
an output pull-down control module, having a first control terminal connected to a pull-up control node, a second control terminal connected to the high level terminal, a third control terminal connected to the output terminal of the shift register unit, a first input terminal connected to the low level terminal, a first output terminal connected to the pull-down control node and a second output terminal connected to an output control node, the output pull-down control module being configured to provide a power supply enable signal and a power supply signal at the output control node;
an output control module, having a first control terminal connected to the pull-up control node, a first input terminal connected to a first clock signal terminal, a first output terminal connected to the output terminal of the shift register unit, a second control terminal connected to the output terminal of the shift register unit, a second input terminal connected to the high level terminal, a second output terminal connected to a gate drive signal terminal, a third control terminal connected to a fourth stage output terminal, a third input terminal connected to the gate drive signal terminal, a third output terminal connected to the low level terminal, a fourth control terminal connected to a second clock signal terminal, a fourth input terminal connected to the output control node, a fourth output terminal connected to a power supply signal terminal, a fifth control terminal connected to a third clock signal terminal, a fifth input terminal connected to the output control node, and a fifth output terminal connected to a power supply enable signal terminal, the fourth stage output terminal being an output terminal of a corresponding fourth shift register unit in the case that the shift register is used as the first stage shift register unit, and the output control module being configured to generate a gate drive signal and output the power supply enable signal, the power supply signal and the gate drive signal.

2. The shift register unit according to claim 1, wherein the output control module comprises a first output control sub-module and a second output control sub-module, the first output control sub-module being configured to output the gate drive signal, and the second output control sub-module being configured to output the power supply enable signal and the power supply signal.

3. The shift register unit according to claim 2, wherein the input module comprises a first transistor, having a gate connected to the input signal terminal, a source connected to the high level terminal and the output control module, and a drain connected to the pull-up control node.

4. The shift register unit according to claim 3, wherein the reset module comprises a second transistor and a third transistor;
wherein the second transistor has a gate connected to a gate of the third transistor, a source connected to the output terminal of the shift register unit, and a drain connected to the low level terminal; and
the third transistor has the gate connected to the fifth stage output terminal, a source connected to the pull-up control node, and a drain connected to the low level terminal.

5. The shift register unit according to claim 4, wherein the pull-down module comprises a fourth transistor and a fifth transistor;
wherein the fourth transistor has a gate connected to the pull-down control node, a source connected to the output terminal of the shift register unit, and a drain connected to the low level terminal; and
the fifth transistor has a gate connected to the pull-down control node, a source connected to the pull-up control node, and a drain connected to the low-level terminal.

6. The shift register unit according to claim 5, wherein the output pull-down control module comprises a sixth transistor, a seventh transistor, an eighth transistor, a ninth transistor and a tenth transistor;
wherein the sixth transistor has a gate connected to the pull-up control node, a source connected to the pull-down control node, and a drain connected to the low level terminal;
the seventh transistor has a gate connected to a drain of the eighth transistor and a gate of the ninth transistor, a source connected to the high level terminal, and a drain connected to the pull-down control node;
the eighth transistor has a gate connected to the high level terminal, a source connected to the high level terminal, and the drain connected to the gate of the ninth transistor;
the ninth transistor has the gate connected to the gate of the seventh transistor, a source connected to the high level terminal VGH, and a drain connected to the output control node; and
the tenth transistor has a gate connected to the output terminal of the shift register unit, a source connected to the output control node, and a drain connected to the low level terminal.

7. The shift register unit according to claim 6, wherein the first output control sub-module comprises an eleventh transistor, a twelfth transistor and a thirteenth transistor, and the second output control sub-module comprises a fourteenth transistor and a fifteenth transistor;

wherein the eleventh transistor has a gate connected to the pull-up control node, a source connected to the first clock signal terminal, and a drain connected to the output terminal of the shift register unit;
the twelfth transistor has a gate connected to the output terminal of the shift register unit, a source connected to the high level terminal, and a drain connected to the gate drive signal terminal;
the thirteenth transistor has a gate connected to the fourth stage output terminal, a source connected to the gate drive signal terminal, and a drain connected to the low level terminal;
the fourteenth transistor has a gate connected to the second clock signal terminal, a source connected to the output control node, and a drain connected to the power supply signal terminal; and
the fifteenth transistor has a gate connected to the third clock signal terminal, a source connected to the output control node, and a drain connected to the power supply enable signal terminal.

8. The shift register unit according to claim 7, wherein the source of the first transistor is connected to the source of the twelfth transistor; and the drain of the first transistor is connected to the gate of the eleventh transistor, the source of the third transistor, the source of the fifth transistor, and the gate of the sixth transistor;
the source of the second transistor is connected to the drain of the eleventh transistor, the gate of the twelfth transistor, the source of the fourth transistor, and the gate of the tenth transistor; and the drain of the second transistor is connected to the drain of the fourth transistor, the drain of the fifth transistor, the drain of the sixth transistor, the drain of the tenth transistor, and the drain of the thirteenth transistor;
the source of the third transistor is connected to the source of the fifth transistor, the gate of the eleventh transistor and the gate of the sixth transistor; and the drain of the third transistor is connected to the drain of the fifth transistor, the drain of the fourth transistor, the drain of the sixth transistor, the drain of the tenth transistor, and the drain of the thirteenth transistor;
the gate of the fourth transistor is connected to the source of the sixth transistor and the drain of the seventh transistor; the source of the fourth transistor is connected to the drain of the eleventh transistor, the gate of the twelfth transistor, and the gate of the tenth transistor; and the drain of the fourth transistor is connected to the drain of the sixth transistor, the drain of the tenth transistor, and the drain of the thirteenth transistor;
the gate of the fifth transistor is connected to the source of the sixth transistor and the drain of the seventh transistor; the source of the fifth transistor is connected to the gate of the eleventh transistor and the gate of the sixth transistor; and the drain of the fifth transistor is connected to the drain of the sixth transistor, the drain of the tenth transistor, and the drain of the thirteenth transistor;
the gate of the sixth transistor is connected to the gate of the eleventh transistor, and the drain of the sixth transistor is connected to the drain of the thirteenth transistor;
the drain of the ninth transistor is connected to the source of the fourteenth transistor and the source of the fifteenth transistor; and
the gate of the tenth transistor is connected to the gate of the twelfth transistor, the source of the tenth transistor is connected to the source of the fourteenth transistor and the source of the fifteenth transistor, and the drain of the tenth transistor is connected to the drain of the thirteenth transistor.

9. The shift register unit according to claim 8, wherein a frequency of a signal of the first clock signal terminal is different from a frequency of a signal of the second clock signal terminal, the signal of the second clock signal terminal and a signal of the third clock signal being mutually inverted signals.

10. A driving method of the shift register unit according to claim 1, comprising:
a first phase, in which the input module receives a high level signal of the input signal terminal, and charges the pull-up control node with the high level signal of the high-level terminal; the output control module receives the high level signal of the pull-up control node and the signal of the first clock signal terminal to provide a signal to the output terminal of the shift register unit, and outputs the gate drive signal at the gate drive signal terminal based on the signal of the output terminal of the shift register unit and the signal of the fourth stage output terminal; the output pull-down control module receives the signal of the output terminal of the shift register unit and the high level signal of the high level terminal to provide the power supply enable signal and the power supply signal at the output control node; the output control module receives the signal of the second clock signal terminal and the signal of the third clock signal terminal, and outputs the power supply enable signal and the power supply signal respectively at the power supply enable signal terminal and the power supply signal terminal; and
a second phase, in which the reset module receives the high level signal of the fifth stage output terminal, and resets the output terminal of the shift register unit and the pull-up control node to the low level signal; the output pull-down control module receives the low level signal of the pull-up control node, and provides the high level signal to the pull-down control node; the pull-down module receives the high level signal of the pull-down control node, and discharges the pull-up control node and the output terminal of the shift register unit; the output control module receives the low level signal of the pull-up control node and the signal of the fourth stage output terminal, and outputs the low level signal at the gate drive signal terminal; the output pull-down control module receives the signal of the output terminal of the shift register unit and the high level signal of the high level terminal to provide a high level signal at the output control node; the output control module receives the signal of the second clock signal terminal and the signal of the third clock signal terminal, and outputs the power supply enable signal and the power supply signal, which are both high level signals, respectively at the power supply enable signal terminal and the power supply signal terminal.

11. The driving method of the shift register unit according to claim 10, the first phase further comprises:
when the gate of the first transistor receives the high level signal of the input signal terminal, the first transistor being turned on, the high level signal of the high level terminal being used for charging the pull-up control node; and when the gate of the first transistor receives the low level signal of the input signal terminal, the first transistor being turned off, the signal of the pull-up control node being kept as the high level signal;

receiving, by the gate of the eleventh transistor, the high level signal of the pull-up control node, the eleventh transistor being turned on; and receiving, by the eleventh transistor, the signal of the first clock signal terminal and transmitting the signal of the first clock signal terminal to the output terminal of the shift register unit as the signal of the output terminal of the shift register unit;

receiving, by the gate of the twelfth transistor, the signal of the output terminal of the shift register unit, the twelfth transistor being turned on or off to output the gate drive signal or the low level signal at the gate drive signal terminal;

receiving, by the gate of the tenth transistor, the signal of the output terminal of the shift register unit and the high level signal of the high level terminal; and generating, by the output control node, the power supply enable signal and the power supply signal;

receiving, by the gate of the fourteenth transistor, the high level signal of the second clock signal terminal, the fourteenth transistor being turned on to output the power supply signal or the high level signal at the power supply signal terminal;

receiving, by the gate of the fifteenth transistor, the high level signal of the third clock signal terminal, the fifteenth transistor being turned on to output the power supply enable signal or the high level signal at the power supply enable signal terminal;

wherein the signal of the second clock signal and the signal of the third clock signal are mutually inverted signals.

12. The driving method of the shift register unit according to claim 10, the second phase further comprises:
receiving, by the gate of the second transistor, the high level signal of the fifth stage output terminal, the second transistor being turned on, and the output terminal of the shift register unit being reset to the low level signal;

receiving, by the gate of the third transistor, the high level signal of the fifth stage output terminal, the second transistor being turned on, and the pull-up control node being reset to the low level signal;

receiving, by the gate of the sixth transistor, the low level signal of the pull-up control node, the sixth transistor being turned off;

receiving, by the gate of the eighth transistor, the high level signal of the high level terminal, the eighth transistor being turned on;

receiving, by the gate of the seventh transistor, the high level signal of the high level terminal through the eighth transistor, the seventh transistor being turned on to provide the high level signal to the pull-down control node;

receiving, by the gate of the fourth transistor, the high level signal of the pull-down control node, the fourth transistor being turned on to discharge the output terminal of the shift register unit;

receiving, by the gate of the fifth transistor, the high level signal of the pull-down control node, the fifth transistor being turned on to discharge the pull-up control node;

receiving, by the gate of the tenth transistor, the low level signal of the output terminal of the shift register unit, the tenth transistor being turned off;

receiving, by the gate of the ninth transistor, the high level signal of the high level terminal through the eighth transistor, the ninth transistor being turned on to provide the high level signal to the output control node;

receiving, by the gate of the fourteenth transistor, the high level signal of the second clock signal terminal, the fourteenth transistor being turned on to output the high level signal at the power supply signal terminal;

receiving, by the gate of the fifteenth transistor, the high level signal of the third clock signal terminal, the fifteenth transistor being turned on to output the high level signal at the power supply enable signal terminal;

wherein the signal of the second clock signal and the signal of the third clock signal are mutually inverted signals.

13. A shift register, comprising multiple cascaded stages of the shift register units according to claim 1, wherein an output terminal of a previous stage shift register unit is connected to an input signal terminal of a next stage shift register unit.

14. The shift register according to claim 13, wherein the shift register comprises N stages of the shift register units, N being an integer no less than 4;

wherein both the first clock signal terminal of an i-th stage shift register unit and the first clock signal terminal of an (i+2)-th stage shift register unit input the first clock signal, and both the first clock signal terminal of an (i+1)-th stage shift register unit and the first clock signal terminal of an (i+3)-th stage shift register unit input the inverted signal of the first clock signal; both the second clock signal terminal of the i-th stage shift register unit and the second clock signal terminal of the (i+1)-th stage shift register unit input the second clock signal, and both the second clock signal terminal of the (i+2)-th stage shift register unit and the second clock signal terminal of the (i+3)-th stage shift register unit input the inverted signal of the second clock signal; and both the third clock signal terminal of the i-th stage shift register unit and the third clock signal terminal of the (i+1)-th stage shift register unit input the inverted signal of the second clock signal, and both the third clock signal terminal of the (i+2)-th stage shift register unit and the third clock signal terminal of the (i+3)-th stage shift register unit input the second clock signal, where i is an integer, $i \geq 1$ and $(i+3) \leq N$.

15. A display device comprising the shift register according to claim 13, wherein the power supply enable signal, the power supply signal and the gate drive signal provided by the shift register unit in the shift register are used for driving a pixel cell in the display device.

16. The shift register unit according to claim 1, wherein the input module comprises a first transistor, having a gate connected to the input signal terminal, a drain connected to the high level terminal and the output control module, and a source connected to the pull-up control node.

17. The shift register unit according to claim 1, wherein the reset module comprises a second transistor and a third transistor;

wherein the second transistor has a gate connected to a gate of the third transistor, a drain connected to the output terminal of the shift register unit, and a source connected to the low level terminal; and the third transistor has the gate connected to the fifth stage output terminal, a drain connected to the pull-up control node, and a source connected to the low level terminal.

18. The shift register unit according to claim 1, wherein the pull-down module comprises a fourth transistor and a fifth transistor;

wherein the fourth transistor has a gate connected to the pull-down control node, a drain connected to the output terminal of the shift register unit, and a source connected to the low level terminal; and the fifth transistor has a gate connected to the pull-down control node, a drain connected to the pull-up control node, and a source connected to the low-level terminal.

19. The shift register unit according to claim 1, wherein the output pull-down control module comprises a sixth transistor, a seventh transistor, an eighth transistor, a ninth transistor and a tenth transistor;

wherein the sixth transistor has a gate connected to the pull-up control node, a drain connected to the pull-down control node, and a source connected to the low level terminal;

the seventh transistor has a gate connected to a source of the eighth transistor and a gate of the ninth transistor, a drain connected to the high level terminal, and a source connected to the pull-down control node;

the eighth transistor has a gate connected to the high level terminal, a drain connected to the high level terminal, and the source connected to the gate of the ninth transistor;

the ninth transistor has the gate connected to the gate of the seventh transistor, a drain connected to the high level terminal VGH, and a source connected to the output control node; and the tenth transistor has a gate connected to the output terminal of the shift register unit, a drain connected to the output control node, and a source connected to the low level terminal.

20. The shift register unit according to claim 2, wherein the first output control sub-module comprises an eleventh transistor, a twelfth transistor and a thirteenth transistor, and the second output control sub-module comprises a fourteenth transistor and a fifteenth transistor;

wherein the eleventh transistor has a gate connected to the pull-up control node, a drain connected to the first clock signal terminal, and a source connected to the output terminal of the shift register unit;

the twelfth transistor has a gate connected to the output terminal of the shift register unit, a drain connected to the high level terminal, and a source connected to the gate drive signal terminal;

the thirteenth transistor has a gate connected to the fourth stage output terminal, a drain connected to the gate drive signal terminal, and a source connected to the low level terminal;

the fourteenth transistor has a gate connected to the second clock signal terminal, a drain connected to the output control node, and a source connected to the power supply signal terminal; and the fifteenth transistor has a gate connected to the third clock signal terminal, a drain connected to the output control node, and a source connected to the power supply enable signal terminal.

* * * * *